(12) United States Patent
Tekumalla et al.

(10) Patent No.: US 8,793,546 B2
(45) Date of Patent: Jul. 29, 2014

(54) INTEGRATED CIRCUIT COMPRISING SCAN TEST CIRCUITRY WITH PARALLEL REORDERED SCAN CHAINS

(75) Inventors: Ramesh C. Tekumalla, Breinigsville, PA (US); Prakash Krishnamoorthy, Bethlehem, PA (US); Parag Madhani, Allentown, PA (US)

(73) Assignee: LSI Corporation, San Jose, CA (US)

( * ) Notice: Subject to any disclaimer, the term of this patent is extended or adjusted under 35 U.S.C. 154(b) by 379 days.

(21) Appl. No.: 13/164,345

(22) Filed: Jun. 20, 2011

(65) Prior Publication Data

US 2012/0324303 A1    Dec. 20, 2012

(51) Int. Cl.
  *G01R 31/28*  (2006.01)
  *G06F 11/00*  (2006.01)
  *G01R 31/3185*  (2006.01)

(52) U.S. Cl.
  CPC  *G01R 31/318563* (2013.01); *G01R 31/318572* (2013.01)
  USPC .............................. 714/729; 714/731; 714/30

(58) Field of Classification Search
  USPC ......... 714/729, 726–728, 731–734, 738–739, 714/744, 30–31
  See application file for complete search history.

(56) References Cited

U.S. PATENT DOCUMENTS

| | | | |
|---|---|---|---|
| 6,640,324 B1 | 10/2003 | Goldovsky | |
| 6,886,145 B2 | 4/2005 | Davidson et al. | |
| 7,249,298 B2 * | 7/2007 | Sim | 714/726 |
| 7,512,851 B2 * | 3/2009 | Wang et al. | 714/726 |
| 7,831,876 B2 | 11/2010 | Goyal et al. | |
| 2003/0037296 A1 | 2/2003 | Yoshimoto | |
| 2009/0235132 A1 | 9/2009 | Wang et al. | |
| 2009/0265596 A1 * | 10/2009 | Chen et al. | 714/729 |
| 2010/0218060 A1 | 8/2010 | Nakako | |
| 2011/0099442 A1 * | 4/2011 | Hales et al. | 714/729 |
| 2011/0258504 A1 * | 10/2011 | Cheng et al. | 714/729 |

OTHER PUBLICATIONS

Chris Allsup, "The Economics of Implementing Scan Compression to Reduce Test Data Volume and Test Application Time," IEEE International Test Conference (ITC), Oct. 2006, pp. 1-9.

(Continued)

*Primary Examiner* — Christine Tu
(74) *Attorney, Agent, or Firm* — Ryan, Mason & Lewis, LLP

(57) ABSTRACT

An integrated circuit comprises scan test circuitry and additional internal circuitry subject to testing utilizing the scan test circuitry. The scan test circuitry comprises a plurality of scan chains, with each such scan chain comprising a plurality of flip-flops configurable to operate as a serial shift register. The plurality of scan chains are arranged in sets of two or more parallel scan chains. The scan test circuitry further comprises multiplexing circuitry, including a plurality of multiplexers each associated with a corresponding one of the sets of parallel scan chains and configured to multiplex scan test outputs from the parallel scan chains within the corresponding one of the sets of parallel scan chains. In one embodiment, one or more of the sets of parallel scan chains comprise respective pairs of parallel scan chains with each such pair corresponding to a single original scan chain. A given one of the pairs of parallel scan chains comprises an even scan chain and an odd scan chain, formed by reordering the corresponding single original scan chain.

15 Claims, 5 Drawing Sheets

(56) References Cited

OTHER PUBLICATIONS

D. Hsu et al., "Scan Compression Implementation in Industrial Design—Case Study," Proceedings of the Asian Test Symposium, 2009, 2 pages.

R. Kapur et al., Historical Perspective on Scan Impression, IEEE Design & Test of Computers, Mar.-Apr. 2008, pp. 114-120, vol. 25, No. 2.

P. Wohl et al., "Minimizing the Impact of Scan Compression," IEEE VLSI Test Symposium (VTS), May 2007, pp. 67-74.

* cited by examiner

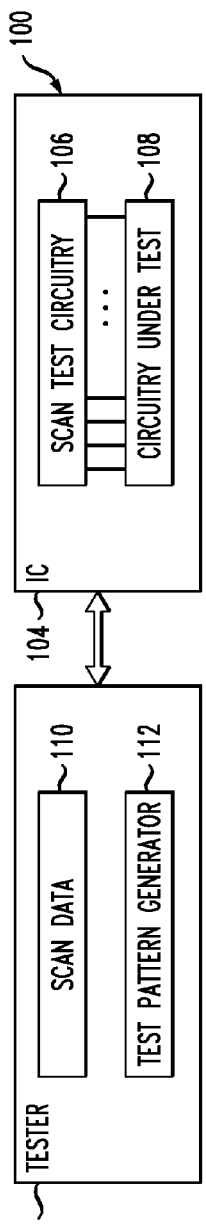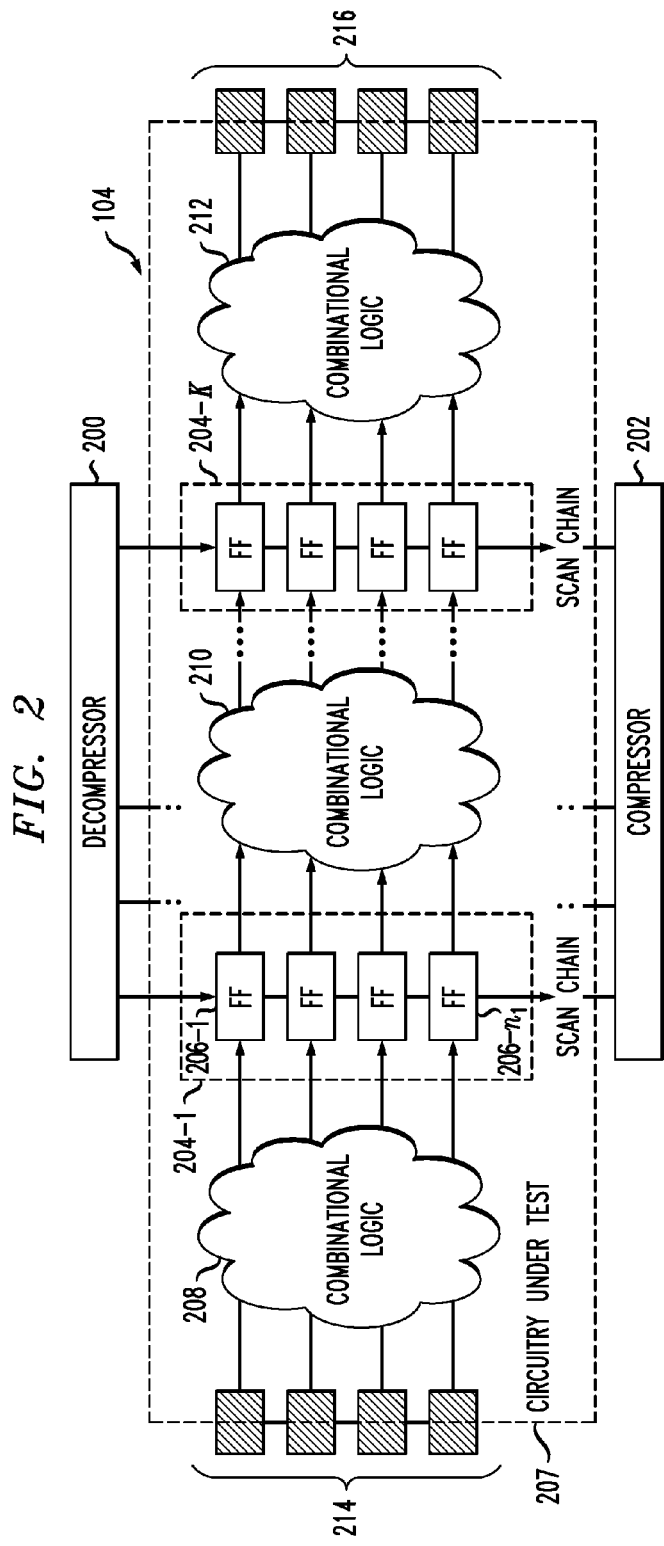

INTEGRATED CIRCUIT COMPRISING SCAN TEST CIRCUITRY WITH PARALLEL REORDERED SCAN CHAINS

FIELD OF THE INVENTION

The present invention relates generally to integrated circuit testing, and more particularly to integrated circuit testing using scan test circuitry.

BACKGROUND OF THE INVENTION

Integrated circuits are often designed to incorporate scan test circuitry that facilitates testing for various internal fault conditions. Such scan test circuitry typically comprises scan chains, which are chains of flip-flops that are used to form serial shift registers for applying test patterns as inputs to combinational logic of the integrated circuit and for reading out the corresponding results.

In one exemplary arrangement, an integrated circuit with scan test circuitry may have a scan shift mode of operation and a functional mode of operation. A flag may be used to indicate whether the integrated circuit is in scan shift mode or functional mode. In the scan shift mode, the flip-flops of the scan chain are configured as a serial shift register. A test pattern is then shifted into the serial shift register formed by the flip-flops of the scan chain. Once the desired test pattern has been shifted in, the scan shift mode is disabled and the integrated circuit is placed in its functional mode. Internal combinational logic results occurring during this functional mode of operation are then captured by the chain of scan flip-flops. The integrated circuit is then once again placed in its scan shift mode of operation, in order to allow the captured combinational logic results to be shifted out of the serial shift register formed by the scan flip-flops, as a new test pattern is being scanned in. This process is repeated until all desired test patterns have been applied to the integrated circuit.

As integrated circuits have become increasingly complex, scan compression techniques have been developed which reduce the number of test patterns that need to be applied when testing a given integrated circuit, and therefore also reduce the required test time. However, the use of high levels of scan compression can adversely impact diagnostic resolution, that is, the ability to attribute a particular failure to an exact fault or set of faults within the combinational logic. As a result, when using scan compression, a tradeoff exists between compression level and diagnostic resolution. Additional details regarding compressed scan testing are disclosed in U.S. Pat. No. 7,831,876, entitled "Testing a Circuit with Compressed Scan Subsets," which is commonly assigned herewith and incorporated by reference herein.

SUMMARY OF THE INVENTION

Illustrative embodiments of the invention provide improved circuitry and techniques for scan testing of integrated circuits. For example, in one or more such embodiments, scan test circuitry is configured to permit scan chains to be reordered such that a single original scan chain may be separated into multiple parallel scan chains. This reduces scan test time without compromising diagnostic resolution, or alternatively can improve diagnostic resolution without requiring increased test time. The disclosed circuitry and techniques can be utilized in a wide variety of scan testing applications, with or without scan compression.

In one aspect, an integrated circuit comprises scan test circuitry and additional internal circuitry subject to testing utilizing the scan test circuitry. The scan test circuitry comprises a plurality of scan chains, with each such scan chain comprising a plurality of flip-flops configurable to operate as a serial shift register, and the plurality of scan chains comprising sets of two or more parallel scan chains. The scan test circuitry further comprises multiplexing circuitry, including a plurality of multiplexers each associated with a corresponding one of the sets of parallel scan chains and configured to multiplex scan test outputs from the parallel scan chains within the corresponding one of the sets of parallel scan chains.

One or more of the sets of parallel scan chains may comprise respective pairs of parallel scan chains with each such pair corresponding to a single original scan chain. A given one of the pairs of parallel scan chains comprises an even scan chain and an odd scan chain, formed by reordering the corresponding single original scan chain.

The multiple scan chains formed from the single original scan chain operate in parallel with one another and thus the time required to shift test patterns into the given scan chain and to read the corresponding results out of the given scan chain is reduced by a factor of the number of parallel chains that are formed. Thus, for example, in an arrangement in which a given scan chain is reordered to form two parallel chains, the required shift time is reduced by a factor of two. The integrated circuit designer is thereby provided with considerable additional flexibility when attempting to balance compression level and diagnostic resolution, and is not constrained to use of particular predetermined tradeoffs implemented by integrated circuit design software vendors.

BRIEF DESCRIPTION OF THE DRAWINGS

FIG. 1 is a block diagram showing an integrated circuit testing system comprising a tester and an integrated circuit under test in an illustrative embodiment.

FIG. 2 illustrates one example of the manner in which scan chains may be arranged between combinational logic in the integrated circuit of FIG. 1.

DETAILED DESCRIPTION OF THE INVENTION

Figure 3:
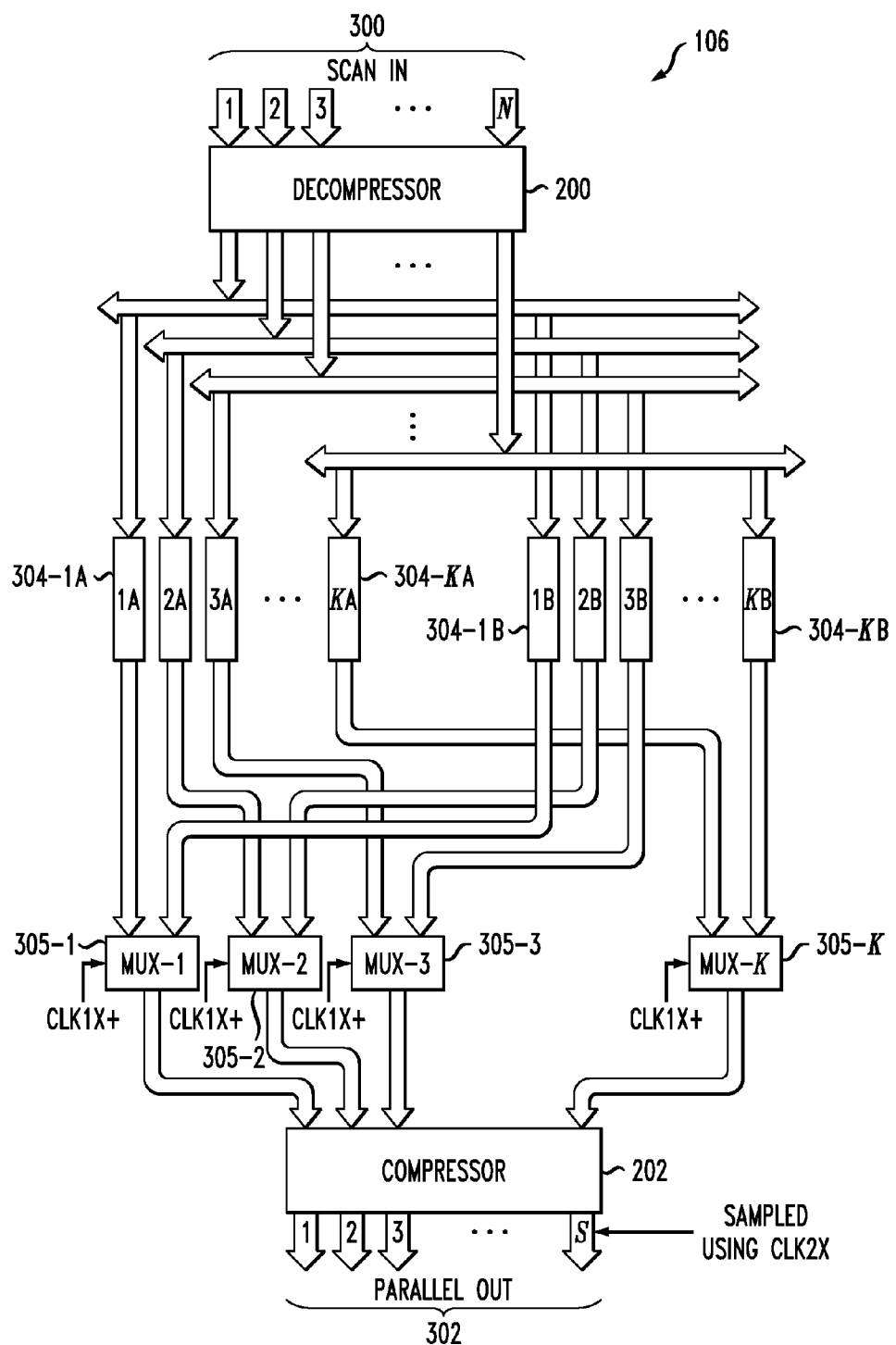
FIG. 3 shows scan test circuitry implemented in the integrated circuit of FIG. 1.

The invention will be illustrated herein in conjunction with exemplary testing systems and corresponding integrated circuits comprising scan test circuitry for supporting scan testing of other internal circuitry of those integrated circuits. It should be understood, however, that the invention is more generally applicable to any testing system or associated integrated circuit in which it is desirable to provide improved flexibility in the configuration of scan chains so as to reduce scan test time without adversely impacting diagnostic resolution or alternatively to increase diagnostic resolution without requiring increased test time.

FIG. 1 shows a testing system 100 comprising a tester 102 and an integrated circuit under test 104. The integrated circuit 104 comprises scan test circuitry 106 that is coupled to additional internal circuitry 108 that is subject to testing utilizing the scan test circuitry 106. The tester 102 stores scan data 110 associated with scan testing of the integrated circuit. Such scan data may correspond to test patterns provided by a test pattern generator 112.

The particular configuration of testing system 100 as shown in FIG. 1 is exemplary only, and the testing system 100 in other embodiments may include other elements in addition to or in place of those specifically shown, including one or more elements of a type commonly found in a conventional implementation of such a system. For example, various elements of the system 100 may be implemented, by way of example and without limitation, utilizing a microprocessor, central processing unit (CPU), digital signal processor (DSP), application-specific integrated circuit (ASIC), field-programmable gate array (FPGA), or other type of data processing device, as well as portions or combinations of these and other devices.

Embodiments of the present invention may be configured to utilize compressed or noncompressed scan testing, and the invention is not limited in this regard. However, certain embodiments such as those shown in FIGS. 2 and 3 will be described in the context of compressed scan testing.

Referring now to FIG. 2, portions of one potential configuration of the integrated circuit 104 are shown in greater detail. In this compressed scan testing arrangement, the scan test circuitry 106 comprises a decompressor 200, a compressor 202, and a plurality of scan chains 204-$k$, where k=1, 2, ... K. Each of the scan chains 204 comprises a plurality of flip-flops 206 and is configurable to operate as a serial shift register in a scan shift mode of operation of the integrated circuit 104. For example, the first scan chain 204-1 is of length $n_1$ and therefore comprises $n_1$ flip-flops denoted 206-1 through 206-$n_1$. More generally, scan chain 204-$k$ is of length $n_k$ and therefore comprises a total of $n_k$ flip-flops. Circuitry under test 207 in this embodiment comprises a plurality of combinational logic blocks, of which exemplary blocks 208, 210 and 212 are shown. The combinational logic blocks are illustratively arranged between primary inputs 214 and primary outputs 216 and separated from one another by the scan chains 204.

The decompressor 200 receives compressed scan data from the tester 102 and decompresses that scan data to generate scan test input data that is shifted into the scan chains 204 when such chains are configured as respective serial shift registers in a scan shift mode of operation. The compressor 202 receives scan test output data shifted out of the scan chains 204, also when such chains are configured as respective serial shift registers in the scan shift mode of operation, and compresses that scan test output data for delivery back to the tester 102. Additional details regarding the operation of scan compression elements such as decompressor 200 and compressor 202 may be found in the above-cited U.S. Pat. No. 7,831,876. Again, scan compression elements such as decompressor 200 and compressor 202 may be eliminated in other embodiments.

In the diagram of FIG. 2, the scan chains 204 are each illustratively shown as a single scan chain. However, in accordance with an embodiment of the invention, each such single scan chain is actually implemented within integrated circuit 104 as a corresponding pair of parallel scan chains. By way of example, a given one of the pairs of parallel scan chains comprises an even scan chain and an odd scan chain, formed by reordering the corresponding single scan chain, as will be described below. The scan chains 204 may be viewed as examples of what are referred to as "original scan chains" herein, as such chains are single chains that may be part of a preliminary design of integrated circuit 104 prior to reordering of those chains into respective sets of parallel scan chains in an actual implementation of that integrated circuit. Accordingly, FIG. 2 may be viewed as representative of a preliminary design of integrated circuit 104 prior to its actual implementation. The term "original" as used herein with respect to scan chains of such a design is intended to be construed broadly to encompass any scan chain prior to reordering of that chain into multiple parallel scan chains.

FIG. 3 shows the scan test circuitry 106 in greater detail, illustrating the pairs of parallel scan chains with each such pair corresponding to one of the single scan chains 204 of FIG. 2. By way of example, in the embodiment of FIG. 3, compressed scan input data is applied by tester 102 to scan inputs 300 of decompressor 200 and compressor 202 provides compressed scan output data back to tester 102 via scan outputs 302. Sets of parallel scan chains 304 are arranged between the decompressor 200 and compressor 202 as shown. More specifically, each of a plurality of single original scan chains 304-1 through 304-K is implemented as a corresponding pair of parallel scan chains denoted A and B. Thus, for example, first scan chain 304-1 is implemented as a pair of parallel scan chains 304-1A and 304-1B, and final scan chain 304-K is implemented as a pair of parallel scan chains 304-KA and 304-KB.

The scan test circuitry 106 in the FIG. 3 embodiment therefore comprises K pairs of parallel scan chains A and B. Each of the individual parallel scan chains 1A, 2A, 3A, ... KA and 1B, 2B, 3B, ... KB is configurable to operate as a serial shift register in a scan shift mode of operation of the integrated circuit 104 and also to capture functional data from combinational logic elements in a functional mode of operation of the integrated circuit 104.

In the present embodiment, the decompressor 200 provides a separate scan input signal to each of the pairs of parallel scan chains. However, within a given such pair, each of the scan chains of the pair are driven with the same scan input signal. Accordingly, scan test data may be shifted simultaneously into each of the parallel scan chains of a given one of the pairs of parallel scan chains.

The scan test circuitry 106 in this embodiment further comprises multiplexing circuitry that illustratively includes a plurality of multiplexers 305-1, 305-2, 305-3, ... 305-K, each associated with a corresponding one of the pairs of parallel scan chains including an even scan chain denoted kA and an odd scan chain denoted kB, where as noted above k=1, 2, 3, ... K. Each of the multiplexers 305 is configured to multiplex scan test outputs from the parallel scan chains within its corresponding one of the pairs of parallel scan chains. By way of example, the multiplexer 305 associated with a given one of the pairs of parallel scan chains receives as its inputs the outputs of the parallel scan chains of that pair and has a select line that operates so as to permit sequential selection of all of the multiplexer inputs within a single clock cycle of a clock signal used to shift data through the parallel scan chains.

In this embodiment, in which each original scan chain is reordered to form two parallel scan chains of approximately equal length, the select line of a given multiplexer 305 operates using a clock signal CLK1X+ that selects a first one of the two data inputs of that multiplexer for the first half of its clock cycle, and the other multiplexer data input for the second half of its clock cycle. Thus, a given set of parallel scan chains comprises two parallel scan chains, and the multiplexer 305 associated with that set comprises a two-to-one multiplexer that sequentially selects the outputs of the two parallel chains within a single cycle of the scan shift clock.

As will be described below in conjunction with the timing diagram of FIG. 5, in one embodiment the clock signal CLK1X used to shift data through the parallel scan chains runs at a rate of R cycles per second, and the clock signal used to sample the scan outputs of the compressor 202 is a clock denoted CLK2X that runs at a rate of 2R cycles per second. The application of the clock CLK2X to sampling of S parallel output data lines of the compressor 202 is illustrated in FIG. 3. More generally, outputs of a scan test circuitry compressor in an embodiment of the invention may be sampled at a clock rate that is a multiple of a clock rate used to shift data through the parallel scan chains, the multiple being given by the number of parallel scan chains in a given set.

Compressed scan test patterns are supplied to N parallel scan inputs 300 of the decompressor 200 which generates decompressed scan input data streams for each of the original scan chains. More specifically, the decompressor generates K streams comprising decompressed scan test patterns provided to respective pairs of parallel scan chains. Each such stream is fed to both scan chains in its corresponding pair of parallel scan chains. These streams are clocked into the chains at the rate R. Since the even and odd scan chains in a given pair of parallel reordered chains are each approximately half the length of the corresponding original scan chain, it takes approximately half as much time to shift the test patterns into the reordered parallel scan chains as compared to the original scan chain.

Scan test output data is shifted out of the parallel scan chains 304 and into corresponding ones of the multiplexers 305, each of which as noted above has a select line that operates using the clock signal CLK1X+ and accordingly supplies scan test output data from both parallel scan chains in the corresponding A and B pair to the compressor 202 within a given clock cycle of the scan shift clock CLK1X.

The manner in which a given one of the original scan chains 304 is separated into multiple parallel scan chains A and B will now be described with reference to FIG. 4. The upper portion of the figure shows a single original scan chain 400 of length n which comprises flip-flops 402-1 through 402-n. Each flip-flop 402 has a scan input (SI), scan output (SO), functional mode data input (D), functional mode data output (Q), clock input (CLK) and asynchronous reset input (RST).

The flip-flops 402 are configured into the single original scan chain by connecting the scan output of the first flip-flop 402-1 to the scan input of the second flip-flop 402-2, the scan output of the second flip-flop 402-2 to the scan input of the third flip-flop 402-3, and so on through the chain. In an arrangement that utilizes such a length-n scan chain without reordering, the scan input of the first flip-flop 402-1 would be driven by an output of the decompressor 200, and the output of the final flip-flop 402-n would be provided as an input to the compressor 202. However, in the present embodiment, the single original scan chain 400 is reordered to form two parallel scan chains as shown in the lower portion of the figure, namely, an even scan chain 404 and an odd scan chain 406. This reordering, as will be described in more detail below, separates the single original scan chain 400 into two parallel chains 404 and 406 each of which includes alternating flip-flops from the original scan chain. As shown in the figure, the SI and SO connections to the flip-flops are modified to create the parallel reordered chains. However, both of the parallel chains 404 and 406 are driven by the same scan input signal.

For the present example, it is assumed without limitation that the original scan chain length n is an even number, and thus after the reordering into parallel even and odd scan chains the even scan chain 404 comprises flip-flops 402-2, 402-4, . . . , 402-n and the odd scan chain comprises flip-flops 402-1, 402-3, . . . , 402-(n−1). If the original scan chain length n was instead an odd number, after the reordering into parallel even and odd scan chains the even scan chain 404 would comprise flip-flops 402-2, 402-4, . . . , 402-(n−1) and the odd scan chain would comprise flip-flops 402-1, 402-3, . . . , 402-n.

Figure 4:
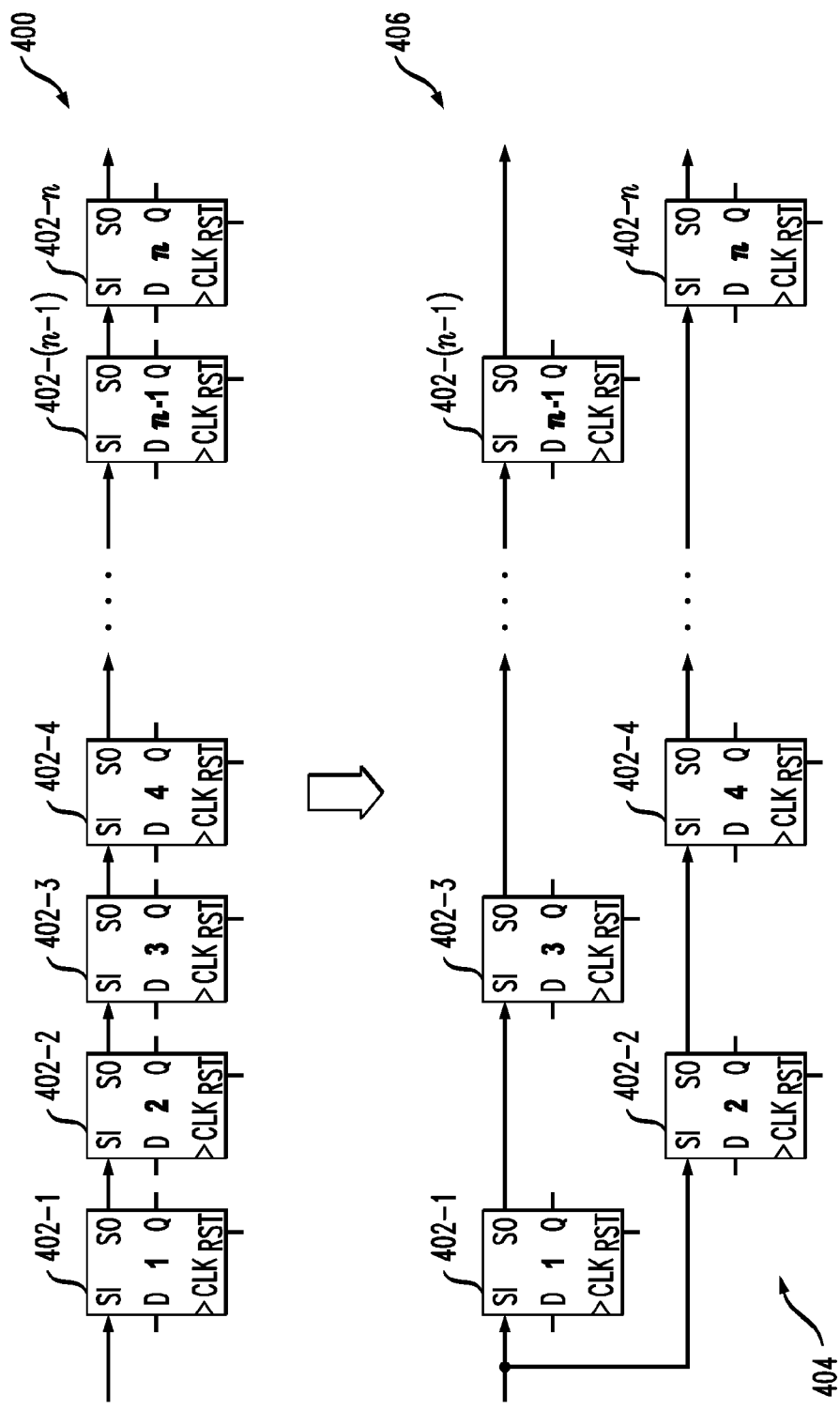
FIG. 4 illustrates one example of the manner in which a single original scan chain may be reordered to form parallel even and odd scan chains for use in the scan test circuitry of FIG. 3.

The scan chains 400, 404 and 406 in the FIG. 4 embodiment are shown without any other intervening elements between the flip-flops 402, but it should be understood that a given scan chain may comprise other logic elements such as slave elements, latches, buffers, inverters or other elements arranged between adjacent flip-flops in the chain. The term "scan chain" as used herein is intended to encompass such arrangements.

It is important to note that after the original scan chain is reordered into a pair of parallel scan chains using the techniques disclosed herein, those parallel chains should each be checked for any clock domain crossings, setup and hold time violations, or other timing issues. Such issues can be resolved, for example, by inserting a latch or a series of inverters between flip-flops in the scan path of the chain as needed. It may be preferable in some embodiments to perform the reordering using a netlist after completion of physical design, so as to reduce area overhead, congestion and routing.

The reordering utilized in the embodiment of FIG. 4 separates the single original scan chain into two parallel chains of approximately equal length. If the single original scan chain length n is an odd number, after reordering the even scan chain is of length $$\frac{n-1}{2}$$

and the odd scan chain is of length $$\frac{n+1}{2}.$$

On the other hand, if n is an even number, after reordering both the even and odd scan chains of the given pair of parallel scan chains are of length $$\frac{n}{2}.$$

An exemplary process for automating a scan chain reordering of this type will be described below in conjunction with FIG. 7.

It is to be appreciated that other types of scan chain reorderings are possible. For example, a given original scan chain may be separated into more than two parallel scan chains of approximately equal length. Accordingly, alternative embodiments of the invention may utilize sets of three, four, or more parallel scan chains, with each such set corresponding to a single original scan chain, although using more than three parallel scan chains may unduly increase the correlation between the test patterns while also significantly increasing the complexity of the multiplexing circuitry.

As another example, a given implementation of the scan test circuitry 106 need not reorder each original scan chain into the same number of parallel scan chains. Furthermore, it is not necessary for all of the parallel scan chains of the scan test circuitry 106 to have approximately the same chain length.

Each of the parallel scan chain pairs kA and kB of the FIG. 3 scan test circuitry may be formed utilizing the exemplary reordering of FIG. 4. As noted above, in such an arrangement, a clock signal CLK1X is used to shift data through the parallel scan chains 304, a clock signal CLK1X+ is used to operate the select lines of the multiplexers 305, and a clock signal CLK2X operating at twice the rate of CLK1X is used to sample the scan data outputs of the compressor 202. A timing diagram illustrating one possible arrangement of the three clock signals CLK1X, CLK1X+ and CLK2X is shown in FIG. 5. In this example, there are two CLK2X clock cycles within one cycle of CLK1X, with the time period for one CLK1X clock cycle being 30 ns and the time period for one CLK2X clock cycle being 15 ns. The CLK1X and CLK2X clocks have pulse widths of approximately 6 ns and 3 ns, respectively.

The CLK1X+ clock is at a logic low level for the first half of its 30 ns cycle and at a logic high level for the second half of its 30 ns cycle. This signal is therefore configured to select one of the two inputs of a given multiplexer 305 for the first half of its cycle and the other multiplexer input for the second half of its cycle.

The sampling of scan outputs of the compressor 202 occurs approximately 6 ns before the rising edge of each CLK2X pulse, as illustrated for the first two pulses of the CLK2X signal by the two downward arrows in the figure.

The scan test circuitry 106 in the present embodiment can be used in conjunction with standard test generation tools or other types of testers. In order to provide the tester with the appropriate information regarding the scan test circuitry, waveform tables may be defined. Examples of such waveform tables corresponding to the timing diagram of FIG. 5 will now be described.

One possible waveform table for the scan shift clocks may be as follows:

```
WaveformTable "_shift_default_WFT_" {
Period '30000ps';
Waveforms {
"all_inputs" { 01ZN { '0ps' D/U/Z/N; }}
"all_bidirectionals" { 01ZN { '0ps' D/U/Z/N; }}
"all_bidirectionals" { XHTL { '0ps' X; '13000ps' X/H/T/L; }}
"all_outputs" { XHTL { '0ps' X; '13000ps' X/H/T/L; }}
CLK1X { P { '0ps' D; '21000ps' U; '27000ps' D; }}
CLK1X+ { P { '0ps' D; '15000ps' U; '30000ps' D; }}
EXT_0 { P { '0ps' D; '15000ps' U; '23000ps' D; }}
EXT_1 { P { '0ps' D; '15000ps' U; '23000ps' D; }}
}
}
```

The above example waveform table defines scan shift clocks CLK1X, EXT_0 and EXT_1, and the multiplexer select line clock CLK1X+, each with a period of 30 ns. The group "all_outputs" excludes the scan out pins that are driven by the outputs of the compressor 202. The waveform table indicates that stimuli are applied at 0 ns and outputs are sampled at 13 ns.

An exemplary waveform table for the scan out pins and sampling clock CLK2X may be as shown below:

```
WaveformTable "_sample_scanout_WFT_" {
Period '15000ps';
```

-continued

```
Waveforms {
"all_scanouts" { XHTL { '0ps' X; '3000ps' X/H/T/L; }}
CLK2X { P { '0ps' D; '9000ps' U; '12000ps' D; }}
}
}
```

As is apparent, the period of the sampling clock CLK2X is 15 ns and half that of the scan shift clocks. Also, the sampling of the scan out pins happens at 3 ns and hence twice within the scan shift clock cycle. The information captured by the waveform tables above is provided to the tester 102 so that it can apply test patterns appropriate for use with the reordered parallel scan chains.

Figure 5:
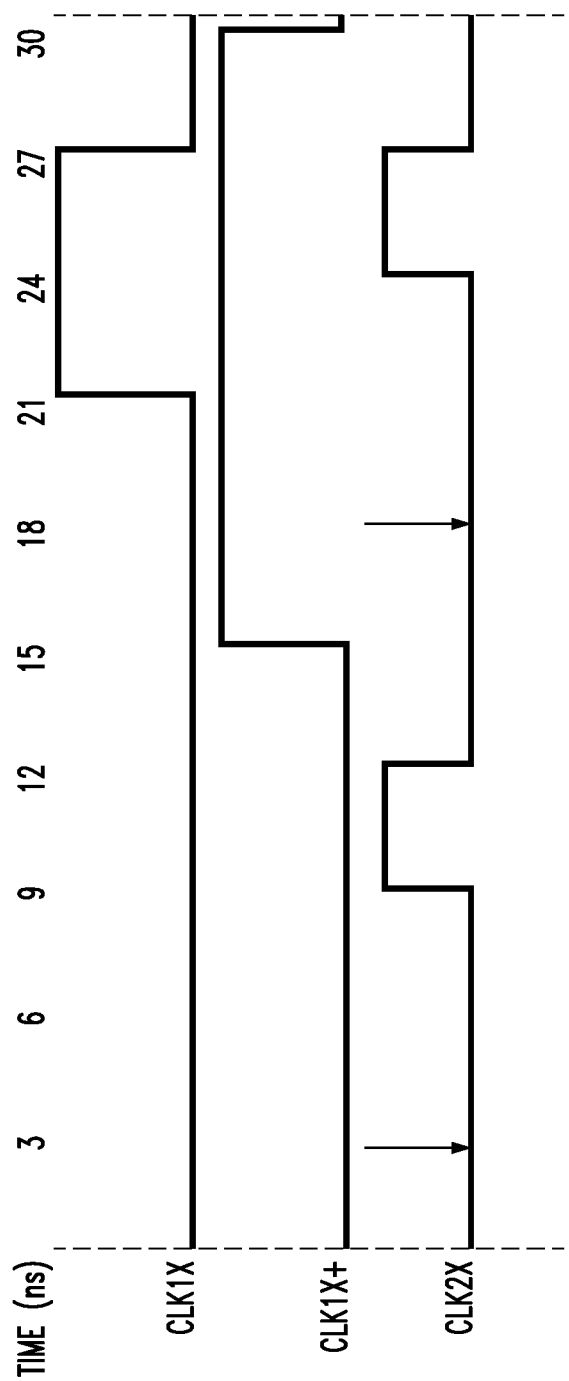
FIG. 5 is a timing diagram showing scan shift and multiplexer select clock signals utilized in the scan test circuitry of FIG. 3.

It should be understood that the particular clock signals shown in the timing diagram of FIG. 5 and defined in the associated waveform tables are presented by way of illustrative example only, and other signaling arrangements may be used in alternative embodiments. For example, in an embodiment in which each original scan chain is reordered into three parallel scan chains, a clock signal CLK3X may be used to sample the compressor outputs at a rate of 3R and two select line clock signals may be used to sequentially select each of the three inputs of a three-to-one multiplexer within a given cycle of the scan shift clock CLK1X. Also, signaling parameters such as clock pulse width, clock period, and scan output sampling points may be varied.

Figure 6:
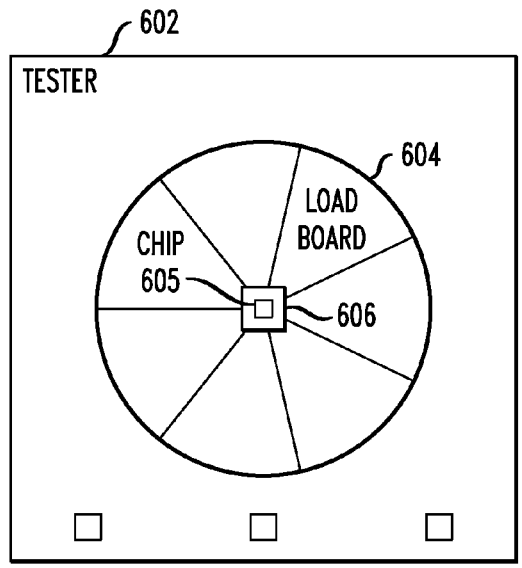
FIG. 6 shows one possible implementation of the testing system of FIG. 1.

The tester 102 in the testing system 100 of FIG. 1 need not take any particular form. One possible example is shown in FIG. 6, in which a tester 602 comprises a load board 604 in which an integrated circuit 605 to be subject to scan testing using the techniques disclosed herein is installed in a central portion 606 of the load board 604. The tester 602 may also comprise processor and memory elements for executing stored computer code, although such elements are not explicitly shown in the figure. Numerous alternative testers may be used to perform scan testing of an integrated circuit as disclosed herein.

Figure 7:
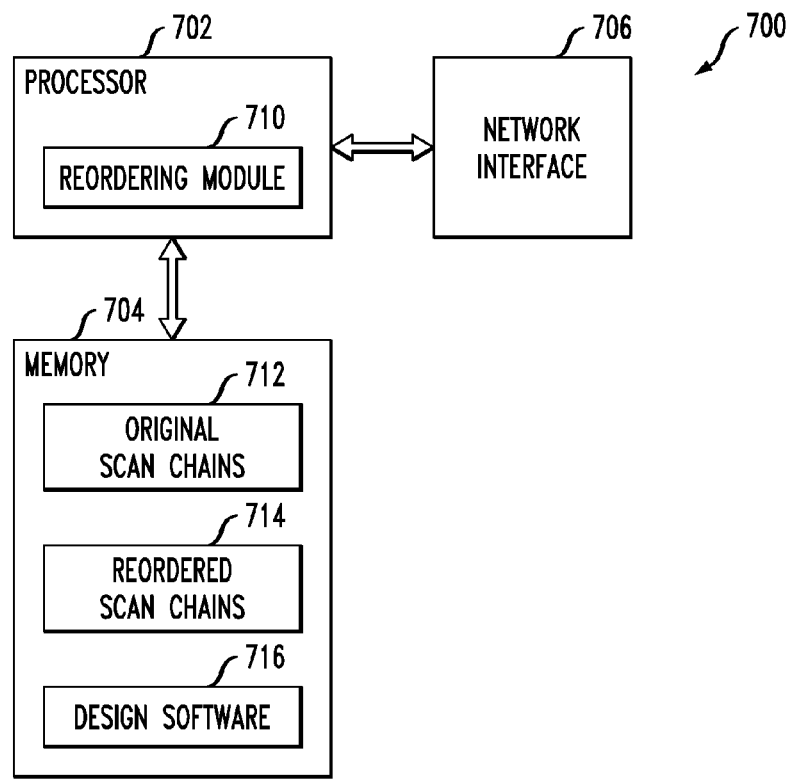
FIG. 7 is a block diagram of a processing system for reordering an original scan chain to form parallel even and odd scan chains for use in the scan test circuitry of FIG. 3.

The reordering of original scan chains to form respective sets of parallel scan chains may be performed in a processing system 700 of the type shown in FIG. 7. Such a processing system is configured for use in designing integrated circuits such as integrated circuit 104 to include scan test circuitry 106. The processing system 700 comprises a processor 702 coupled to a memory 704. Also coupled to the processor 702 is a network interface 706 for permitting the processing system to communicate with other systems and devices over one or more networks. The network interface 706 may therefore comprise one or more transceivers. The processor 702 implements a reordering module 710 for reordering original scan chains 712 into respective sets of reordered parallel scan chains 714 in the manner disclosed herein, in conjunction with utilization of integrated circuit design software 716.

Elements such as 710, 712, 714 and 716 are implemented at least in part in the form of software stored in memory 704 and processed by processor 702. For example, the memory 704 may store program code that is executed by the processor 702 to implement particular scan chain reordering functionality of module 710 within an overall integrated circuit design process. The memory 704 is an example of what is more generally referred to herein as a computer-readable medium or other type of computer program product having computer program code embodied therein, and may comprise, for example, electronic memory such as RAM or ROM, magnetic memory, optical memory, or other types of storage devices in any combination. The processor 702 may comprise a microprocessor, CPU, ASIC, FPGA or other type of processing device, as well as portions or combinations of such devices.

As noted above, the processing system 700 of FIG. 7 implements a scan chain reordering process. By way of example, such a process may take as its input original scan chains in an integrated circuit design and modify the connectivity of the flip-flops in each original scan chain so as to form multiple parallel scan chains. At the end of this process, each of the original scan chains will have been reordered into a pair of parallel scan chains both of which can have the same scan test input data applied thereto.

As previously described, the index k is used to denote a particular one of K original scan chains, where k=1, 2, 3, . . . K, and $n_k$ is used to denote the total number of flip-flops in the k-th scan chain, that is, the length of the k-th scan chain. In this example, we also use the index x to denote a particular one of the flip-flops in the k-th scan chain, where x=1, 2, 3, . . . $n_k$. Each flip-flop in the scan chain is further identified by the type F of scan flip-flop used. Accordingly, an instance name F(k, x) may be used to uniquely identify the x-th flip-flop in the k-th scan chain. A scan-in net of this flip-flop may be denoted Net(k, x) and a scan-out net of this flip-flop may be denoted Net(k, x+1). The process of reordering the original scan chains may be outlined in the following manner:

1. Set←1
2. In original scan chain k, reconnect the scan-in and scan-out nets as follows:
   a. Disconnect scan-in nets Net(k, x) for x=2, 3, . . . $n_k$
   b. Connect scan-in net of F(k, 2) to scan-in net of F(k, 1)
   c. Connect scan-in net of F(k, x) to scan-out net of F(k, x−2) for x=3, 4, . . . $n_k$
3. If k<K, increment k and repeat Step 2. Otherwise if k=K stop as the scan chain reordering is complete.

It is to be understood, however, that the particular process steps and type of chain reordering shown above are exemplary only, and other types of chain reordering techniques may be applied in other embodiments in order to form multiple parallel scan chains from a single original scan chain.

Illustrative embodiments as disclosed herein provide significant improvements in scan testing of integrated circuits, with or without the use of scan compression. For example, in one or more such embodiments, reordering original scan chains into respective sets of multiple parallel scan chains reduces scan test time without compromising diagnostic resolution, or alternatively can increase diagnostic resolution without requiring increased test time. The multiple scan chains formed from the single original scan chain operate in parallel with one another and thus the time required to shift test patterns into the given scan chain and to read the corresponding results out of the given scan chain is reduced by a factor of the number of parallel chains that are formed.

Thus, for example, in an arrangement in which a given scan chain is reordered to form two parallel chains, the required shift time is reduced by a factor of two. The integrated circuit designer is thereby provided with considerable additional flexibility when attempting to balance compression level and diagnostic resolution, and is not constrained to use of particular predetermined tradeoffs implemented by integrated circuit design software vendors.

As indicated above, embodiments of the present invention may be implemented in the form of integrated circuits. In a given such integrated circuit implementation, identical die are typically formed in a repeated pattern on a surface of a semiconductor wafer. Each die includes scan test circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Again, it should be emphasized that the embodiments of the invention as described herein are intended to be illustrative only. For example, the invention can be implemented using a wide variety of other types of scan test circuitry, with different numbers of reordered parallel scan chains for each original scan chain, than those previously described in conjunction with the illustrative embodiments. Also, although the illustrative embodiments are described primarily in the scan compression context, the disclosed techniques can be adapted in a straightforward manner for use in numerous other scan testing applications including those that do not involve scan compression. In such embodiments, components such as decompressor 200 and compressor 202 are eliminated. Accordingly, the particular arrangements of testing system circuitry and other elements as shown in FIGS. 1-3, 6 and 7 may be varied in alternative embodiments. Also, the particular scan chain reordering and scan test circuitry signaling arrangements shown in FIGS. 4 and 5 may be varied in other embodiments. These and numerous other alternative embodiments within the scope of the following claims will be readily apparent to those skilled in the art.

What is claimed is:

1. A method of scan testing an integrated circuit, comprising:
providing scan test inputs to each of a plurality of scan chains, each such scan chain comprising a plurality of flip-flops configurable to operate as a serial shift register, the plurality of scan chains comprising sets of two or more parallel scan chains; and
multiplexing scan test outputs from the parallel scan chains within each of the sets of parallel scan chains, wherein providing scan test inputs comprises driving each of the parallel scan chains of a given one of the sets of two or more parallel scan chains with the same scan input signal;
wherein the scan testing comprises compressed scan testing, the providing further comprises shifting the same scan input signal from a decompressor simultaneously into each of the parallel scan chains of a given one of the sets of parallel scan chains, and the multiplexing comprises shifting scan test output data out of the parallel scan chains of the given set of parallel scan chains to a compressor;
wherein outputs of the compressor are sampled, within a single clock cycle of a clock signal used to shift data through the parallel scan chains, at a clock rate that is a multiple of a clock rate used to shift data through the parallel scan chains, the multiple being given by the number of parallel scan chains in the given set.

2. The method of claim 1 wherein one or more of the sets of parallel scan chains comprise respective pairs of parallel scan chains with each such pair corresponding to a single original scan chain.

3. The method of claim 2 wherein a given one of the pairs of parallel scan chains comprises an even scan chain and an odd scan chain, formed by reordering the corresponding single original scan chain.

4. The method of claim 3 wherein the original scan chain corresponding to the given pair of parallel scan chains is of length n and wherein if n is an odd number, after said reordering the even scan chain of the given pair of parallel scan chains is of length and the odd scan chain of the given pair of parallel scan chains is of length $$\frac{n-1}{2}$$

and further wherein if n is an even number, after said reordering both the even and odd scan chains of the given pair of parallel scan chains are of length $$\frac{n+1}{2}$$

$$\frac{n}{2}.$$

5. The method of claim 3 wherein the original scan chain corresponding to the given pair of parallel scan chains is of length n and comprises flip-flops 1, 2, 3, . . . n and wherein if n is an odd number, after said reordering the even scan chain of the given pair of parallel scan chains comprises flip-flops 2, 4, . . . , n−1 and the odd scan chain of the given pair of parallel scan chains comprises flip-flops 1, 3, . . . , n and further wherein if n is an even number, after said reordering the even scan chain of the given pair of parallel scan chains comprises flip-flops 2, 4, . . . , n and the odd scan chain of the given pair of parallel scan chains comprises flip-flops 1, 3, . . . , n−1.

6. The method of claim 1 wherein said multiplexing scan test outputs from the parallel scan chains within each of the sets of parallel scan chains further comprises, for a given one of the sets, providing outputs of the parallel scan chains of the given set to respective inputs of a corresponding multiplexer and operating a select line of the multiplexer so as to permit sequential selection of all of the multiplexer inputs within the single clock cycle of the clock signal used to shift data through the parallel scan chains.

7. The method of claim 6 wherein the given set comprises two parallel scan chains, and the multiplexer comprises a two-to-one multiplexer.

8. A computer program product comprising a non-transitory computer-readable storage medium having computer program code embodied therein for use in scan testing an integrated circuit, wherein the computer program code when executed in a testing system causes the testing system to perform the steps of the method of claim 1.

9. An integrated circuit comprising:
   scan test circuitry; and
   additional internal circuitry subject to testing utilizing the scan test circuitry;
   the scan test circuitry comprising:
      a plurality of scan chains, each such scan chain comprising a plurality of flip-flops configurable to operate as a serial shift register, the plurality of scan chains comprising sets of two or more parallel scan chains;
      multiplexing circuitry comprising a plurality of multiplexers each associated with a corresponding one of the sets of parallel scan chains and configured to multiplex scan test outputs from the parallel scan chains within the corresponding one of the sets of parallel scan chains, wherein each of the parallel scan chains of a given one of the sets of two or more parallel scan chains is configured to be driven with the same scan input signal;
      a decompressor configured to provide the same scan input signal that is shifted simultaneously into each of the parallel scan chains of at least a given one of the sets of parallel scan chains; and
      a compressor configured to receive scan test output data shifted out of the parallel scan chains of the given set of parallel scan chains via the associated multiplexer;
      wherein outputs of the compressor are sampled, within a single clock cycle of a clock signal used to shift data through the parallel scan chains, at a clock rate that is a multiple of a clock rate used to shift data through the parallel scan chains, the multiple being given by the number of parallel scan chains in the given set.

10. The integrated circuit of claim 9 wherein one or more of the sets of parallel scan chains comprise respective pairs of parallel scan chains with each such pair corresponding to a single original scan chain.

11. The integrated circuit of claim 10 wherein a given one of the pairs of parallel scan chains comprises an even scan chain and an odd scan chain, formed by reordering the corresponding single original scan chain.

12. The integrated circuit of claim 9 wherein the multiplexer associated with a given one of the sets of parallel scan chains receives as its inputs the outputs of the parallel scan chains of that set and has a select line that operates so as to permit sequential selection of all of the multiplexer inputs within the single clock cycle of the clock signal used to shift data through the parallel scan chains.

13. The integrated circuit of claim 12 wherein the given set of parallel scan chains comprises two parallel scan chains, and the multiplexer associated with that set comprises a two-to-one multiplexer.

14. A processing system comprising:
   a processor; and
   a memory coupled to the processor and configured to store information characterizing at least one original scan chain of an integrated circuit design;
   wherein the processing system is configured to:
   modify the integrated circuit design by reordering the original scan chain to form a plurality of parallel scan chains;
   provide scan test inputs to each of the plurality of parallel scan chains;
   multiplex scan test outputs from the parallel scan chains within each of a plurality of sets of two or more parallel scan chains, wherein providing scan test inputs comprises driving each of the parallel scan chains of a given one of the sets of two or more parallel scan chains with the same scan input signal;
   shift the same scan input signal from a decompressor simultaneously into each of the parallel scan chains of a given one of the sets of parallel scan chains; and
   shift scan test output data out of the parallel scan chains of the given set of parallel scan chains to a compressor;
   wherein outputs of the compressor are sampled, within a single clock cycle of a clock signal used to shift data through the parallel scan chains, at a clock rate that is a multiple of a clock rate used to shift data through the parallel scan chains, the multiple being given by the number of parallel scan chains in the given set.

15. The system of claim 14 wherein the given one of the sets of two or more parallel scan chains comprises a pair of parallel scan chains including an even scan chain and an odd scan chain.

* * * * *

UNITED STATES PATENT AND TRADEMARK OFFICE
CERTIFICATE OF CORRECTION

PATENT NO. : 8,793,546 B2  Page 1 of 1
APPLICATION NO. : 13/164345
DATED : July 29, 2014
INVENTOR(S) : Ramesh C. Tekumalla et al.

It is certified that error appears in the above-identified patent and that said Letters Patent is hereby corrected as shown below:

In the Specification:

Column 9, line 26, please change "Set←1" to --Set $k$←1--

Signed and Sealed this
Twenty-fifth Day of November, 2014

Michelle K. Lee
*Deputy Director of the United States Patent and Trademark Office*